(12) United States Patent
Ding et al.

(10) Patent No.: US 7,288,417 B2
(45) Date of Patent: Oct. 30, 2007

(54) ON-CHIP SIGNAL TRANSFORMER FOR GROUND NOISE ISOLATION

(75) Inventors: Hanyi Ding, Essex Junction, VT (US); Kai D. Feng, Essex Junction, VT (US); Zhong-Xiang He, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 10/905,480

(22) Filed: Jan. 6, 2005

(65) Prior Publication Data

US 2006/0148106 A1    Jul. 6, 2006

(51) Int. Cl.
*H01L 21/00* (2006.01)
(52) U.S. Cl. .......................................... 438/3; 257/275
(58) Field of Classification Search .................... 438/3; 257/275, 531, 532
See application file for complete search history.

(56) References Cited

U.S. PATENT DOCUMENTS

| 5,705,963 | A | * | 1/1998 | Ikeda et al. ................. 333/184 |
| 5,877,667 | A | | 3/1999 | Wollesen |
| 5,884,990 | A | | 3/1999 | Burghartz et al. |
| 5,943,199 | A | * | 8/1999 | Aromin ........................ 361/42 |
| 5,951,276 | A | * | 9/1999 | Jaeschke et al. .............. 431/66 |
| 6,147,582 | A | | 11/2000 | Goldsmith et al. |
| 6,188,306 | B1 | | 2/2001 | Wollesen |
| 6,459,352 | B1 | | 10/2002 | Liu et al. |
| 6,470,803 | B1 | * | 10/2002 | Liu et al. ..................... 102/206 |
| 6,674,247 | B1 | * | 1/2004 | Mead et al. ............. 315/241 P |
| 7,039,372 | B1 | * | 5/2006 | Sorrells et al. ............. 455/118 |
| 2003/0151881 | A1 | | 8/2003 | Yue |

FOREIGN PATENT DOCUMENTS

WO        PCTUS0305133         9/2003

* cited by examiner

*Primary Examiner*—Phuc T. Dang
(74) *Attorney, Agent, or Firm*—Downs Rachlin Martin PLLC

(57) ABSTRACT

A mixed-signal chip having a signal transformer located between analog circuitry and digital circuitry. The signal transformer includes a primary winding electrically coupled to the analog circuitry and a secondary winding electrically coupled to the digital circuitry. The primary and secondary windings are magnetically coupled with one another via a magnetic core. The magnetic coupling between the primary and secondary windings inhibits the coupling of electrical noise between the analog and digital circuitries.

21 Claims, 6 Drawing Sheets

ON-CHIP SIGNAL TRANSFORMER FOR GROUND NOISE ISOLATION

FIELD OF THE INVENTION

The present invention generally relates to the field of integrated circuits. In particular, the present invention is directed to an on-chip signal transformer for ground noise isolation and signal level shift.

BACKGROUND OF THE INVENTION

As system on chip designs become more prevalent, analog circuitry, e.g., radio frequency transceiver circuitry, is more frequently being placed on the same chips as digital circuitry, e.g., digital signal processing circuitry. While this type of design has many benefits, such as compactness of design, challenges arise in preventing electrical noise from one type of circuitry interfering with the operation of the other type of circuitry. This noise coupling is often in the context of noise from the digital circuitry interfering with the operation of the analog circuitry. Noise coupling is becoming more and more critical as the speeds of digital circuitry continue to increase.

Figure 1:
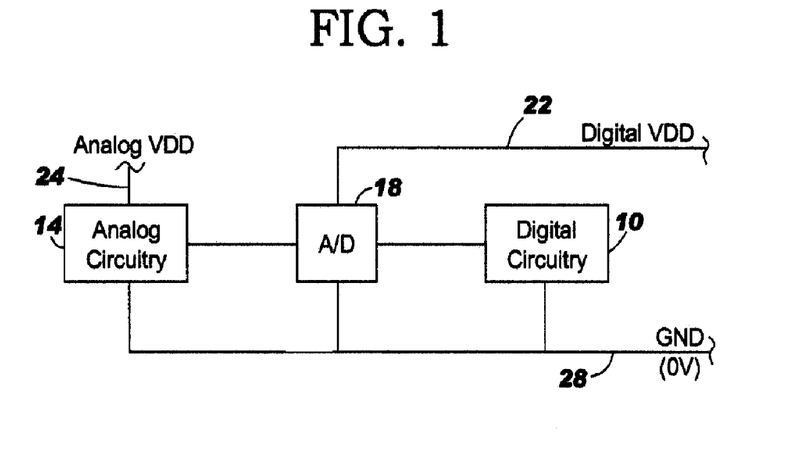
FIG. 1 is a high-level schematic diagram of conventional mixed-signal circuitry.

FIG. 1 illustrates a conventional electrical coupling of digital circuitry 10 and analog circuitry 14 with one another via an analog-to digital converter 18. While each of digital and analog circuitries 10, 14 are connected to separate respective power distribution networks 22, 24, these circuitries share a common ground network 28. Conventional technologies, such as deep trench and voltage island technologies (not shown), provide high substrate impedance between the digital and analog circuitries 10, 14 for isolating the noise. However, these technologies do not inhibit noise coupling through ground network 28 that is common to both the digital and analog circuitries 10, 14. What is needed is a solution that inhibits noise coupling between digital and analog circuitries 10, 14, yet permits signals to pass between these circuitries with high fidelity without pulse width distortion.

SUMMARY OF THE INVENTION

In one aspect, the present application is directed to a method of fabricating an integrated circuit chip comprising analog integrated circuitry, digital integrated circuitry and a microelectronic signal transformer. The method of fabricating the microelectronic signal transformer comprises the steps of a) forming amongst a plurality of layers of the integrated circuit chip a core comprising a magnetic material; b) forming amongst the plurality of layers a first winding; and c) forming amongst the plurality of layers a second winding.

In another aspect, the present invention is directed to an integrated circuit chip that comprises analog integrated circuitry, digital integrated circuitry and a microelectronic signal transformer. The microelectronic signal transformer includes a first winding in electrical communication with the analog integrated circuitry and a second winding in electrical communication with the digital integrated circuitry.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE DRAWINGS

Figure 2:
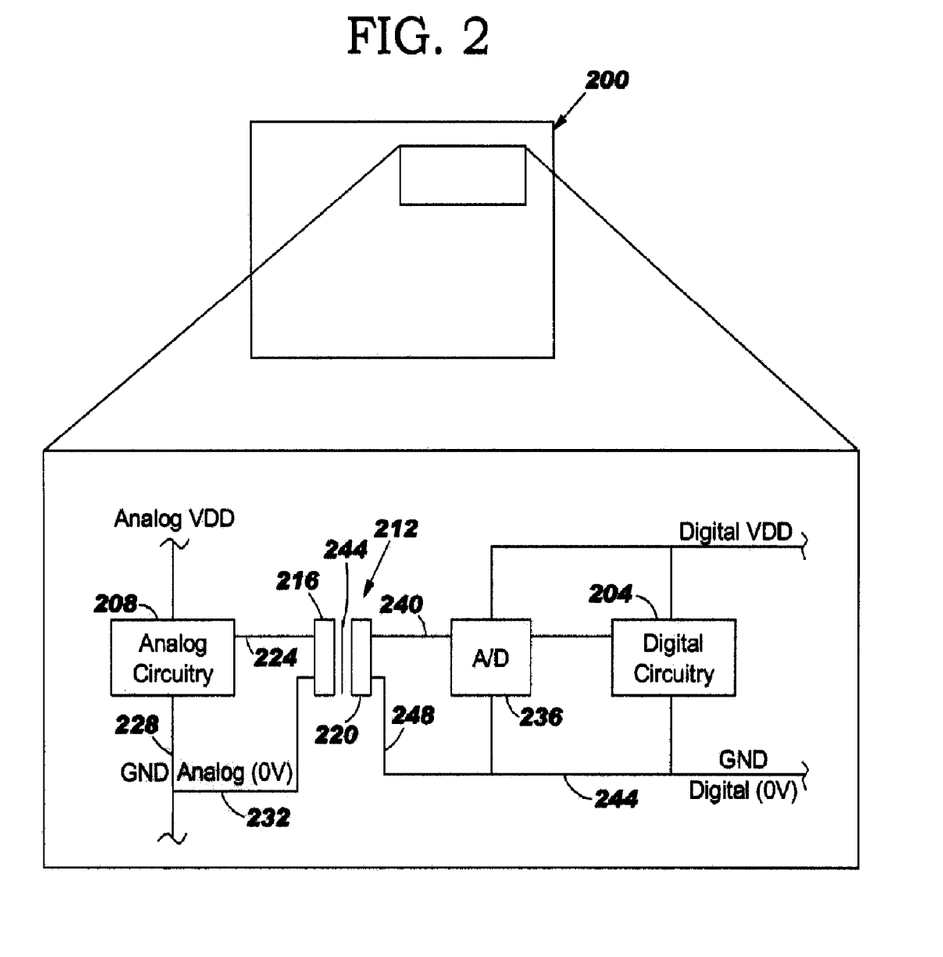
FIG. 2 is a high-level schematic diagram of a microelectronic chip of the present invention containing a signal transformer coupled between analog and digital circuitry.

Referring now to FIG. 2, there is shown in accordance with the present invention a microelectronic mixed-signal chip 200 containing digital circuitry 204 and analog circuitry 208 that are coupled with one another via an isolating signal transformer 212 having a primary winding 216 and a secondary winding 220. As those skilled in the art will readily appreciate, chip 200 may be any chip containing both digital and analog circuitry 204, 208. Examples of such chips include, among others, chips containing direct conversion receivers, software radios, etc.

Primary winding 216 of signal transformer 212 may be electrically connected to analog circuitry 208 via a first signal pathway 224 and to an analog ground 228 via a first ground pathway 232. Similarly, secondary winding 220 of signal transformer 212 may be electrically connected to an A/D converter 236 via a second signal pathway 240 and to a digital ground 244 via a second ground pathway 248. With this connectivity, signal transformer 212 allows analog signals generated by analog circuitry 208 to pass with fidelity to an analog-to-digital (A/D) converter 240, which converts the analog signals to digital signals for processing in digital circuitry 204. Likewise, signal transformer 214 would allow analog signals generated by a digital-to-analog (D/A) converter (not shown) to pass with high fidelity to analog circuitry 208. Beneficially, signal transformer 212, due to the non-electrically conductive magnetic coupling between primary and secondary windings 216, 220 via magnetic core 244, inhibits coupling of electrical noise between digital and analog circuitries 204, 208.

Those skilled in the art will also appreciate that based on the well-known transformer equation, $$V2/V1 = N2/N1 \qquad \{1\}$$

wherein V1 is the signal voltage amplitude in primary winding 216, N1 is the number of turns of the primary winding; V2 is the signal voltage amplitude in secondary winding 220, and N2 is the number of turns of the secondary winding, signal transformer 212 can be designed to provide the necessary voltage level shifting between digital and analog circuitries 204, 208 by selecting a winding ratio N2/N1 appropriate for the desired level shift. It is noted that conventional electronic level shifters always cause pulse width distortion due to threshold variation. In a signal transformer of the present invention, such as signal transformer 212, pulse width fidelity is high since the signal amplitude shift through the transformer is not related to any threshold. Those skilled in the art will readily understand how to determine a winding ratio suitable to achieve the desired level shift. That said, for convenience, many of the examples below illustrate a winding ratio of 1:1.

Figure 3A:
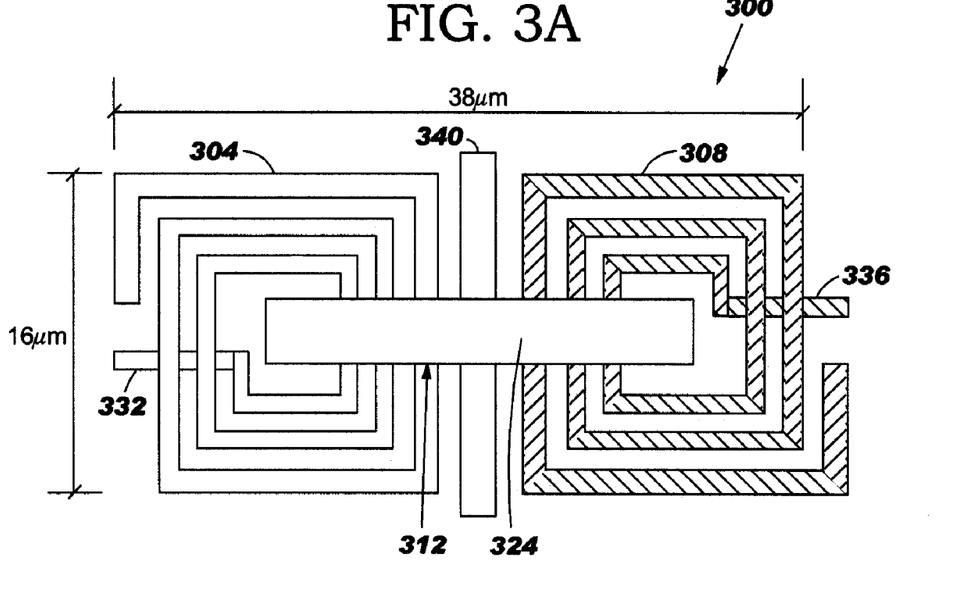
FIG. 3A is a plan view of a core-type signal transformer of the present invention.
Figure 3B:
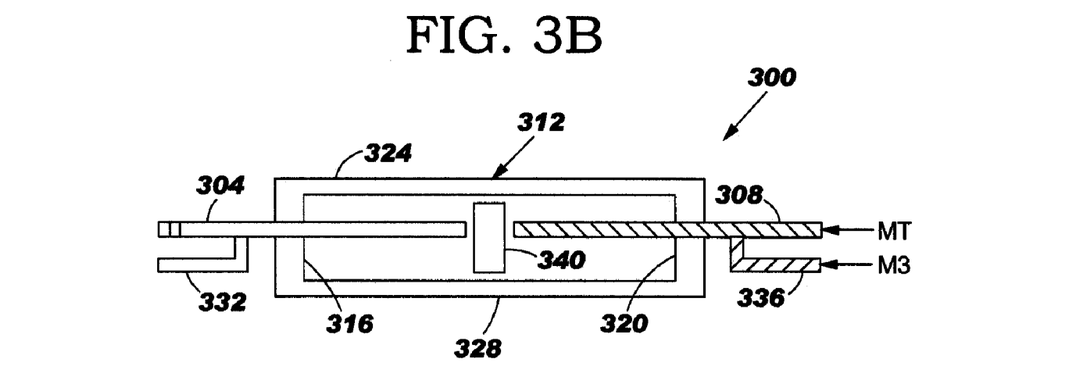
FIG. 3B is a front elevational view of the transformer of FIG. 3A.
Figure 3C:
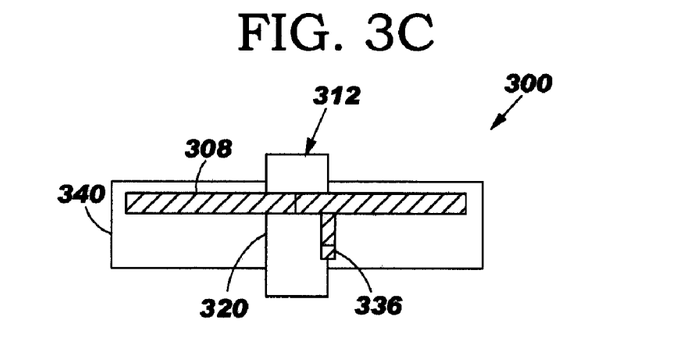
FIG. 3C is a side elevational view of the transformer of FIG. 3A.

FIGS. 3A-3C illustrate a core-type transformer 300 that may be used for signal transformer 212 of FIG. 2. Generally, transformer 300 comprises a primary winding 304, a secondary winding 308 and a magnetic core 312. Transformer 300 may be located virtually anywhere onboard a chip, e.g., chip 200 of FIG. 2, such as in the metal layers, e.g., layers M3 and MT, that typically contain the various power distribution and ground networks (not shown) of the chip. Primary and secondary windings 304, 308 may be made out of any suitable electrically conductive material, e.g., the same metal used in the various metal layers, such as copper or aluminum.

Magnetic core 312 may include magnetic posts 316, 320 and one or more magnetic couplers, e.g., upper and lower magnetic couplers 324, 328, that magnetically couple the magnetic posts with one another so as to form a closed magnetic loop. Magnetic core 312 may be made of any suitable magnetic material. For example, magnetic core 312 may be made of a metal-based soft magnetic material, such as magnetic materials containing iron, nickel, copper, molybdenum, manganese, chromium, or aluminum, or combinations thereof, or the magnetic core may be made of a ferrite (iron oxide-based soft magnetic material), such as $MnFe_2O_3$, $CuFe_2O_3$, $ZnFe_2O_3$, and $NiFe_2O_3$, among others. The selection of magnetic material may be based on the speed of the signals passing through transformer 300. Generally, the metal-based magnetic materials are suitable for relatively low frequency signal applications, e.g., application in which the signal frequency is below several GHz, and the ferrite-based materials are suitable for relative high frequency signal applications, e.g., applications in which the signal frequency is from 1 GHz to about 140 GHz.

The material(s) used for magnetic core 312 may be applied during wafer fabrication using any suitable technique, such as mixing a powder of the magnetic material(s) with a photoresist paste and applying the paste to the wafer, vapor depositing (sputtering) the material(s), or performing a compound controllable deposition. For more detailed information regarding the depositing of the materials of magnetic core 312, the reader is referred to U.S. patent application Ser. No. 10/604,180, filed Jun. 30, 2003 and entitled "On-Chip Inductor With Magnetic Core," which is incorporated by reference herein in its entirety. Other common fabrication techniques, e.g., patterning, via formation, planarizing, etc., are typically also used in forming the various parts of signal transformer 300. Since those skilled in the art will be readily familiar with fabrication techniques that may be used to form signal transformer 300, these need not be either exhaustively listed or described herein for those skilled in the art to make and use the present invention to its fullest scope.

In the embodiment of transformer 300 shown, each of primary and secondary windings 304, 308 is shown as being a rectangular spiral containing three turns. Of course, primary and secondary windings 304, 308 may be any other shape, e.g., octagonal or circular, and may have any number of windings, either the same for both windings or different for each winding, as needed to suit the voltage requirements on both sides of transformer 300. In a simulation based on one fabrication technology, SiGe 5AM technology of International Business Machines, Inc., Armonk, N.Y., signal transformer 300 of FIGS. 3A-3C was developed with three-turn primary and secondary windings 304, 308 on metal layer MT and with underpasses 332, 336 on metal layer M3. The wire width in each winding 304, 308 was 1 µm, the gap between adjacent windings in each winding was 1 µm, the gap between each winding and its respective post 316, 320 was 1 µm, the transverse cross section of each post was 4 µm×4 µm, and the thickness of upper and lower magnetic couplers 324, 328 was 1 µm. The gross plan area of transformer 300 was 38 µm×16 µm. These dimensions are only exemplary and are by no means intended to limit the scope of the present invention, which is defined by the appended claims.

The sizes of the various components of transformer 300 and the transformer itself may be any size needed to suit particular electrical requirements and fabrication technology. In addition, it is noted that primary and secondary windings 304, 308 are shown as being on only one metal layer, i.e., metal layer MT. In alternative embodiments (not shown), windings 304, 308 may be located on two or more metal layers, with immediately adjacent layers connected to one another by vias. An electrically isolating material 340, e.g., a low-K isolating material such as $SiO_2$, Silk or SiCOOH, may be placed between primary and secondary windings 304, 308 to inhibit parasitic capacitance between these windings.

Figure 4A:
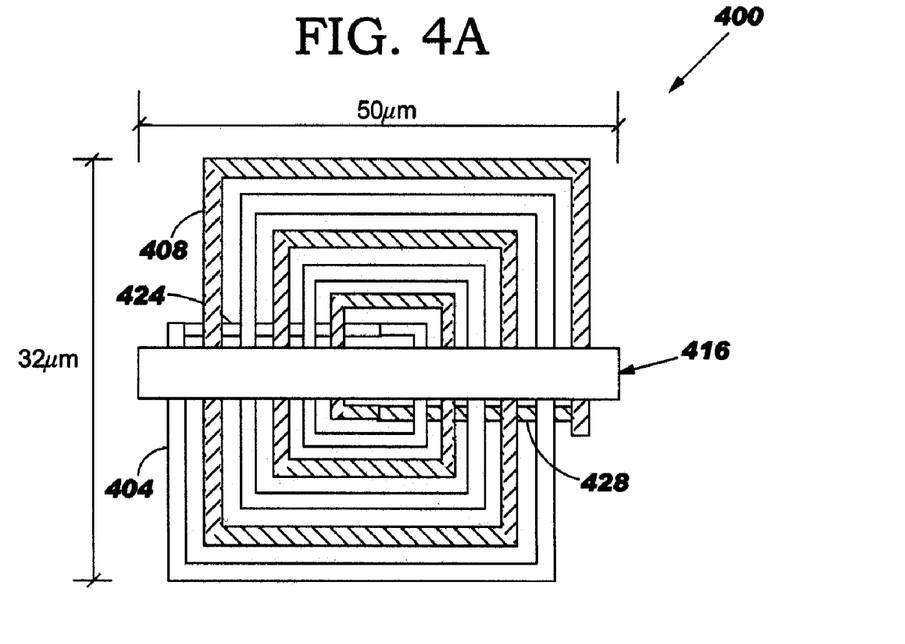
FIG. 4A is a plan view of a shell-type signal transformer of the present invention.
Figure 4B:
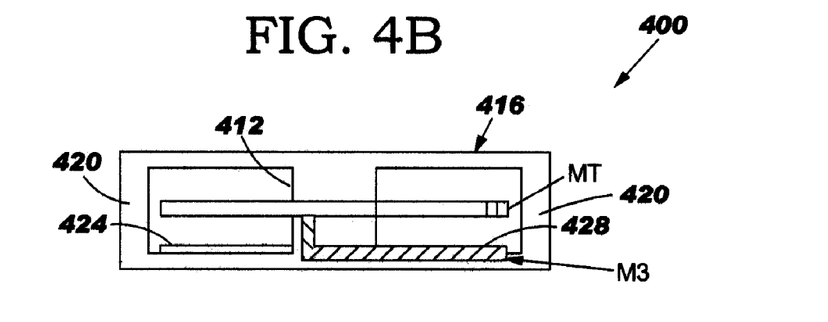
FIG. 4B is a front elevational view of the transformer of FIG. 4A.
Figure 4C:
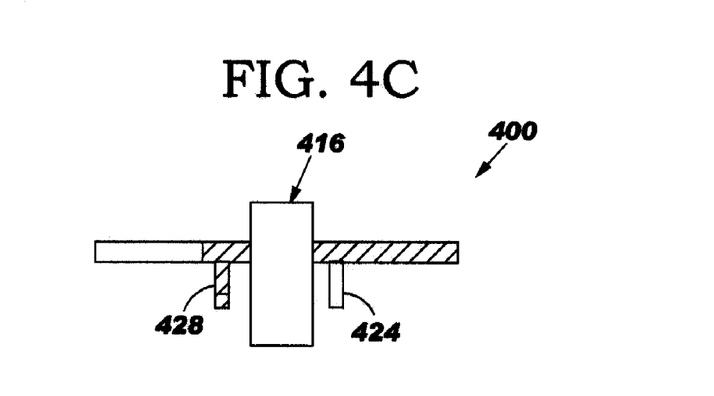
FIG. 4C is a side elevational view of the transformer of FIG. 4A.

FIGS. 4A-4C illustrate a shell-type transformer 400 that may be used for signal transformer 212 of FIG. 2. Transformer 400 may include primary and secondary windings 404, 408 that are concentric, and interwound, with one another about a central post 412 of a magnetic core 416. Magnetic core 416 may also include generally C-shaped magnetic couplers 420 that each form a closed loop with central post 412. The materials of windings 404, 408 and core 416 may be the same as described above relative to signal transformer 300 of FIGS. 3A-3C. Similarly, the location of transformer 400 within a chip and the configurations of primary and secondary windings 404, 408 may vary as described above in connection with signal transformer 300 and corresponding windings 304, 308.

In order to provide an exemplary physical comparison between signal transformer 300 of FIGS. 3A-3C and signal transformer 400 of FIGS. 4A-4C, an embodiment of signal transformer 400 was developed by simulation based on the same SiGe 5AM technology used to develop the embodiment of signal transformer 300 described above. On this basis, signal transformer 400 of FIGS. 4A-4C included two and three-quarter turn primary and secondary windings 404, 408 on metal layer MT and with underpasses 424, 428 on metal layer M3. The wire width in each winding 404, 408 was 1 µm, the gap between adjacent windings was 1 µm, the gap between the innermost winding and central post was 1 µm, the transverse cross section of the central post was 8 µm×8 µm, and the thickness of the upper and lower portions of magnetic couplers was 1 µm. The gross plan area of transformer 400 was 50 µm×32 µm. Again, these dimensions are only exemplary and are by no means intended to limit the scope of the present invention, which is defined by the appended claims. The sizes of the various components of transformer 400 and the transformer itself may be any size needed to suit particular electrical requirements and fabrication technology.

Figure 4D:
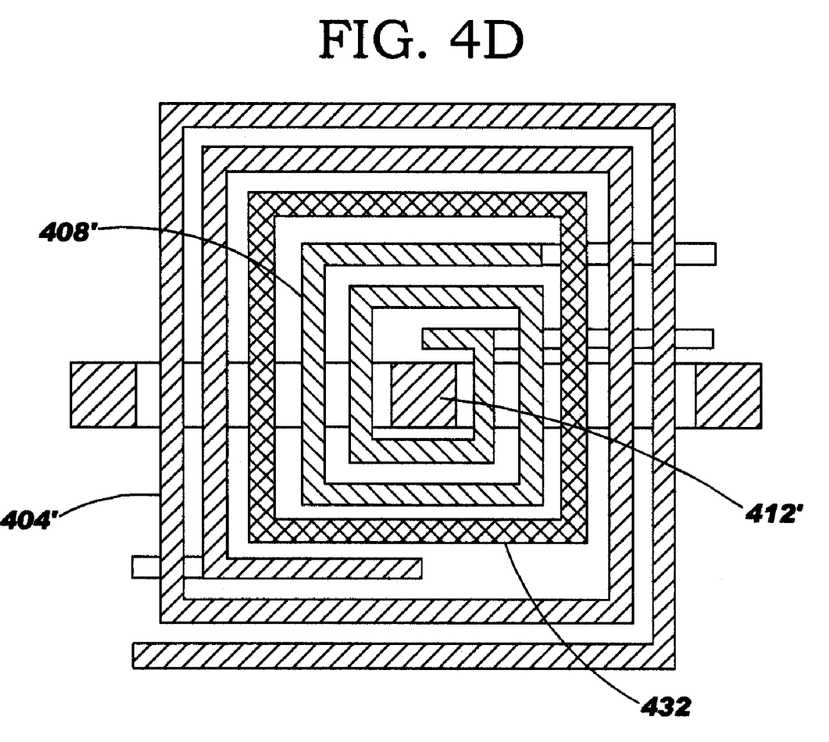
FIG. 4D is a horizontal cross-sectional view of an alternative shell-type transformer of the present invention.

FIG. 4D illustrates a winding pattern for primary and secondary windings 404', 408' that is an alternative to the winding pattern illustrated in FIGS. 4A and 4B. In the winding pattern of FIG. 4D, primary winding 404' is wound radially outward of secondary winding 408', which is wound adjacent central post 412'. An electrically isolating material 432, e.g., a low-K isolation material such as $SiO_2$, Silk or SiCOOH, may be provided in all of the spaces between, around and surrounding primary and secondary windings 404', 408' and central post 412' in order to inhibit parasitic capacitance between the windings.

Figure 4E:
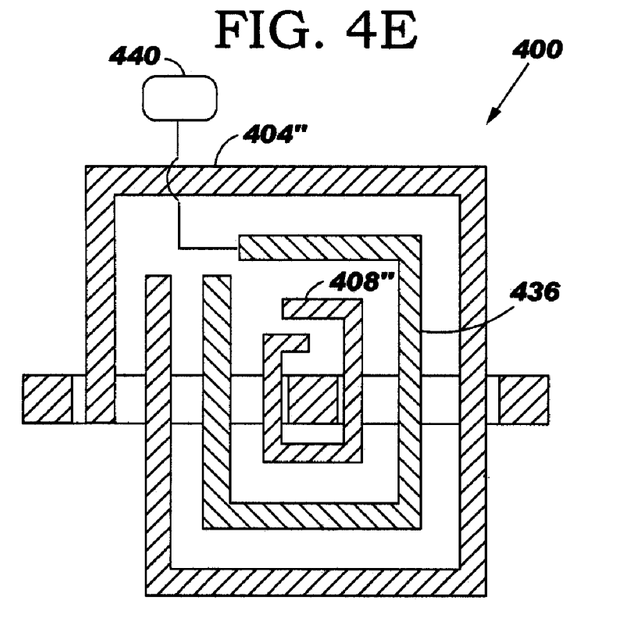
FIG. 4E is a horizontal cross-sectional view of another alternative shell-type transformer of the present invention.

FIG. 4E illustrates a winding pattern similar to the interwound winding pattern of FIGS. 4A and 4B, except that it includes an isolation winding 436 located between primary and secondary windings 404", 408". Isolation winding 436 is an open-loop electrically-conductive, e.g., metal, winding having one end connected to a DC voltage source 440 (usually 0V) with reference to a voltage reference on either the primary side or secondary side of transformer 400". The other end of isolation winding 436 is floating, i.e., not electrically connected. Isolation winding 436 helps to inhibit parasitic capacitance between primary and secondary windings 404", 408" that would generate unwanted electrical coupling.

Figure 5A:
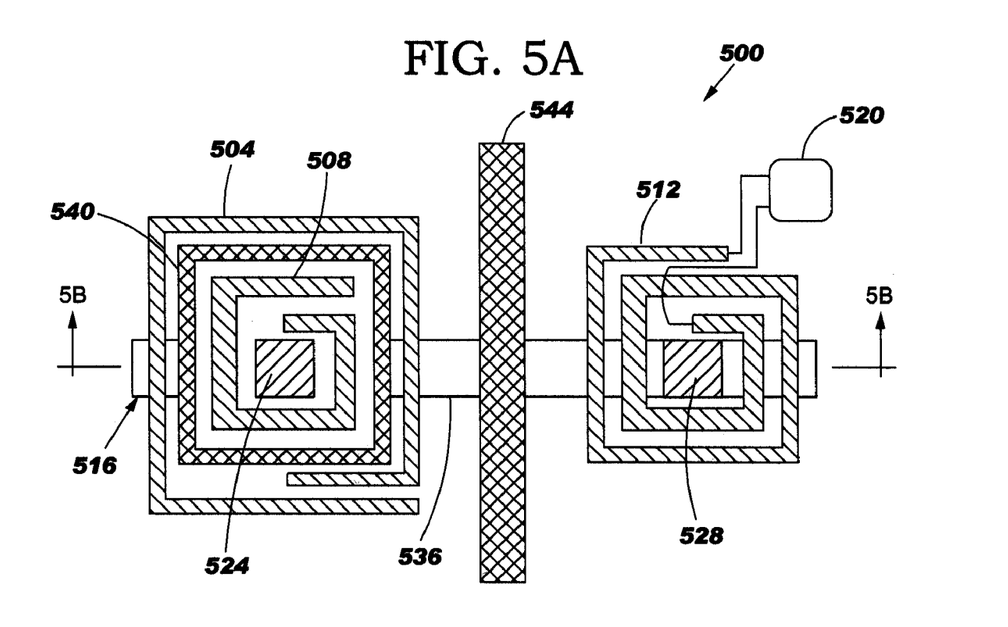
FIG. 5A is a horizontal cross-sectional view of a signal transformer of the present invention having an active control winding.
Figure 5B:
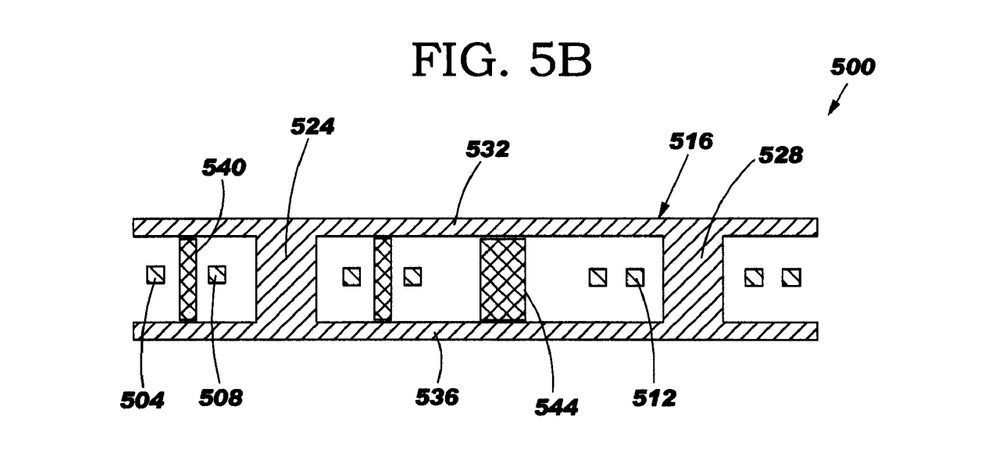
FIG. 5B is a cross-sectional view of the transformer of FIG. 5A as taken along the line 5B-5B.

FIGS. 5A and 5B illustrate another transformer 500 that may be suitable for use as signal transformer 212 of FIG. 2. Transformer 500 is generally similar to shell-type transformer 400 of FIG. 4D, except that in addition to primary and secondary windings 504, 508, transformer 500 also includes a control winding 512. Control winding 512 is especially useful when magnetic core 516 is made of one or more ferrite-based magnetic materials. During use as a signal transformer, it is beneficial to set the magnetic operation point of transformer 500 within the linear portion of the magnetic material's operating range. This is accomplished by energizing control winding 512 with a high-impedance current source 520. Setting the magnetic operation point thusly, maintains the fidelity of the waveform on secondary winding 508. This is especially important when transformer 500 is configured for performing level shifting. Control winding 512 may be made of the same material used for primary and secondary windings 504, 508.

In order to accommodate primary and secondary windings 504, 508 as well as control winding 512, magnetic core 516 may include first and second posts 524, 528 and upper and lower magnetic couplers 532, 536 magnetically coupling the first and second posts with one another. Primary and secondary windings 504, 508 may be separated from one another by an isolating material 540, such as one of the low-K isolation materials mentioned above. Similarly, secondary winding 508 may be separated from control winding 512 by the same or similar isolating material 544. Other features of transformer 500, e.g., number of turns of windings 504, 508, 512, component materials, location, size and shape of components, etc., may be as described above in connection with other embodiments.

Figure 6A:
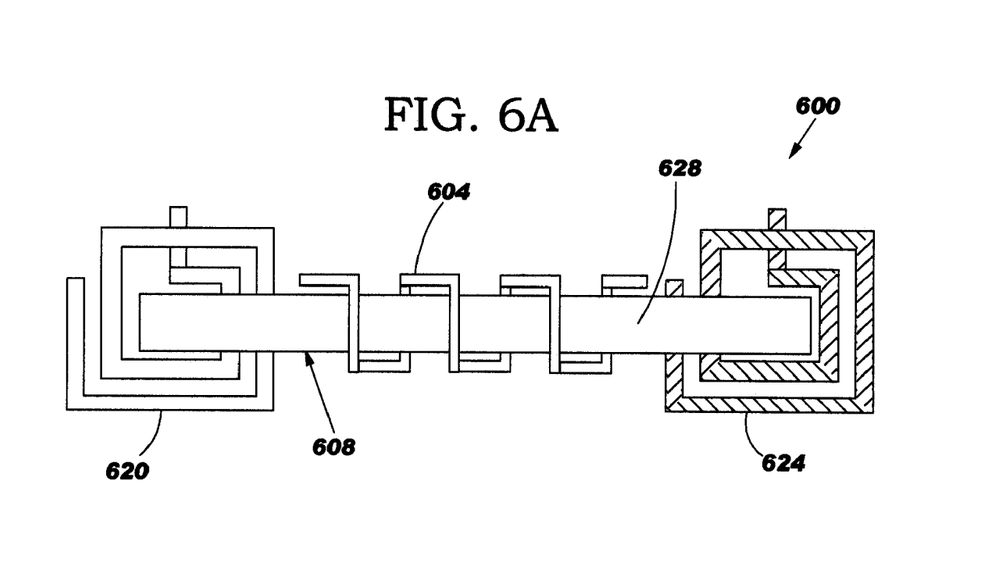
FIG. 6A is a plan view of an alternative signal transformer of the present invention having an active control winding.
Figure 6B:
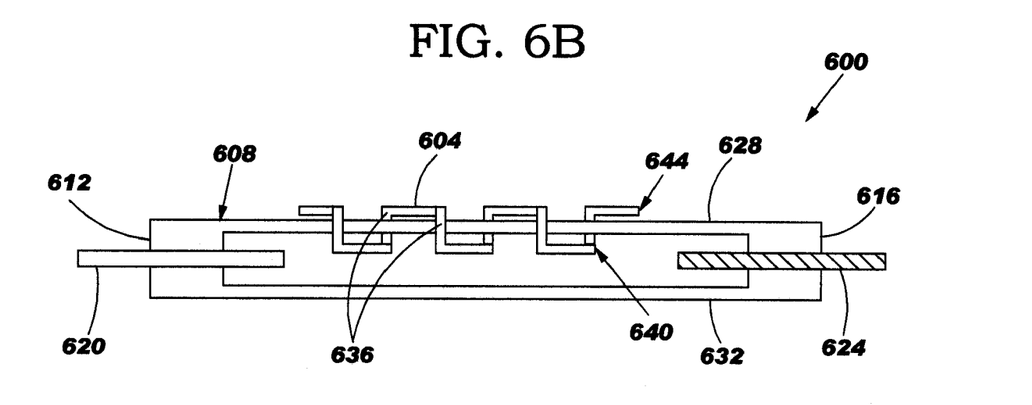
FIG. 6B is an elevational view of the transformer of FIG. 6A.

FIGS. 6A and 6B illustrate yet another transformer 600 that may be suitable for use as signal transformer 212 of FIG. 2. Like transformer 500 of FIGS. 5A and 5B, transformer 600 may include a control winding 604 for controlling the magnetic operational set point of magnetic core 608. However, instead of being similar to shell-type transformer 400 of FIG. 4D, transformer 600 of FIGS. 6A and 6B is generally similar to core-type transformer 300 of FIGS. 3A-3C. That is, magnetic core 608 that includes a pair of posts 612, 616 about each of which a corresponding respective one of primary and secondary windings 620, 624 is wound. Posts 612, 616 may be magnetically coupled with one another by one or more magnetic couplers, e.g., upper and lower magnetic couplers 628, 632.

Control winding 604 may be wound around one, the other, or both, of upper and lower couplers 628, 632. For example, control winding 604 may be provided in the generally helical configuration shown, wherein vertical portions of the winding may be provided using vias 636 connecting horizontal layers 640, 644 containing horizontal portions of the winding. Of course, other configurations of control winding 604 and primary and secondary windings 620, 624 are certainly possible. Transformer 600 of FIGS. 6A and 6B is merely illustrative. Again, other features of transformer 600, e.g., number of turns of windings 604, 620, 624, component materials, location, size and shape of components, etc., may be as described above in connection with other embodiments.

It is noted that although the foregoing transformers 300, 400, 500, 600 have been described as being oriented with the planes of the various windings being parallel with the various fabrication layers used to make these transformers, each of the transformers could also be made by orienting these planes perpendicular to the fabrication layers. Those skilled in the art will readily appreciate the fabrication steps that would need to be used to make transformers in this alternative orientation.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. A method of making a microelectronics chip having a plurality of layers, comprising:
   a) forming amongst the plurality of layers a core made of a magnetic material;
   b) forming amongst the plurality of layers a first winding;
   c) forming amongst the plurality of layers a second winding;
   d) forming amongst the plurality of layers analog circuitry;
   e) forming amongst the plurality of layers digital circuitry;
   f) electrically coupling said first winding to said analog circuitry; and
   g) electrically coupling said second winding to said digital circuitry.

2. A method according to claim 1, wherein the plurality of layers includes a plurality of metal layers and wherein step a) includes forming said core amongst the plurality of metal layers, step b) includes forming said first winding amongst the plurality of metal layers and step c) includes forming said second winding amongst the plurality of metal layers.

3. A method according to claim 1, wherein step a) includes making said core out of a ferrite-based material.

4. A method according to claim 1, wherein step a) includes making said core out of a soft magnetic material.

5. A method according to claim 1, wherein step a) includes forming a first post and step b) includes forming said first winding about said first post.

6. A method according to claim 5, wherein step c) includes forming said second winding about said first post.

7. A method according to claim 5, wherein step a) further includes forming a second post and step c) includes forming said second winding about said second post.

8. A method according to claim 7, further comprising the step of forming a closed magnetic loop containing said first and second posts.

9. An integrated circuit chip, comprising:
a) on-chip analog integrated circuitry;
b) on-chip digital integrated circuitry; and
c) an on-chip microelectronic signal transformer having a first winding in electrical communication with said analog circuitry, and a second winding in electrical communication with said digital circuitry.

10. An integrated circuit chip according to claim 9, further including an on-chip closed-loop magnetic core.

11. An integrated circuit chip according to claim 10, wherein said on-chip closed-loop magnetic core comprises a first magnetic post, said first and second windings being wound about said first magnetic post.

12. An integrated circuit chip according to claim 11, wherein said magnetic core further includes a second post and a control winding wound about said second post.

13. An integrated circuit chip according to claim 9, wherein said on-chip signal transformer includes an isolation winding located between said first and second winding, said isolation winding operatively configured to inhibit electrical coupling between said first and second windings.

14. An integrated circuit chip according to claim 9, further comprising a constant voltage source, said isolation winding being electrically coupled to said voltage source.

15. An integrated circuit chip according to claim 9, wherein said on-chip signal transformer further comprises:
a) a magnetic core magnetically coupled to each of said first and second windings; and
b) a control winding magnetically coupled to said magnetic core.

16. An integrated circuit chip according to claim 15, further comprising a high-impedance current source, said control winding electrically coupled to said high-impedance current source.

17. An article, comprising:
an integrated circuit chip comprising:
a) least one on-chip transformer that includes:
i) a primary winding;
ii) a secondary winding; and
iii) a closed-loop magnetic core magnetically coupling said primary winding to said secondary winding;
b) analog circuitry electrically connected to one of said primary winding and said secondary winding; and
c) digital analog circuitry electrically connected to the other of said primary winding and said secondary winding.

18. An article according to claim 17, wherein said at least one on-chip transformer further includes a conductive isolation winding located between said primary and secondary windings and operatively configured to inhibit electrical coupling between said primary and secondary windings.

19. An article according to claim 17, wherein said at least one on-chip transformer further includes a control winding magnetically coupled to said closed-loop magnetic core.

20. A method of making a microelectronics chip having a plurality of layers, comprising:
a) forming amongst the plurality of layers a core made of a magnetic material, including forming a first post and a second post;
b) forming amongst the plurality of layers a first winding, including forming said first winding about said first post; and
c) forming amongst the plurality of layers a second winding, including forming said second winding about said second post.

21. A method according to claim 20, further comprising the step of forming a closed magnetic loop containing said first and second posts.

* * * * *